United States Patent [19]

Nutz

[11] 4,184,087
[45] Jan. 15, 1980

[54] WINDOW DISCRIMINATOR OR VOLTAGE RANGE SENSOR

[75] Inventor: Karl-Diether Nutz, Oedheim, Fed. Rep. of Germany

[73] Assignee: Licentia Patent-Verwaltungs-G.m.b.H., Frankfurt, Fed. Rep. of Germany

[21] Appl. No.: 891,404

[22] Filed: Mar. 29, 1978

[30] Foreign Application Priority Data

Apr. 7, 1977 [DE] Fed. Rep. of Germany ....... 2715609

[51] Int. Cl.² .......................................... H03K 5/153
[52] U.S. Cl. ................. 307/360; 307/299 B; 307/354; 307/358; 330/261; 330/257
[58] Field of Search ............... 307/350, 354, 358, 360, 307/299 B, 363, 361; 340/661, 662, 663; 330/257, 261

[56] References Cited

U.S. PATENT DOCUMENTS

| | | | |
|---|---|---|---|
| 3,341,748 | 9/1967 | Kammiller | 307/360 X |
| 3,354,448 | 11/1967 | Brolin | 307/360 X |
| 3,457,560 | 7/1969 | McKinley | 307/360 X |
| 3,586,879 | 6/1971 | Ford | 307/360 |

FOREIGN PATENT DOCUMENTS 1275117 8/1968 Fed. Rep. of Germany.
1253305 11/1973 Fed. Rep. of Germany.

*Primary Examiner*—John Zazworsky
*Attorney, Agent, or Firm*—Spencer & Kaye

[57] ABSTRACT

A window discriminator or voltage range sensor has an input for receiving a d.c. voltage to be sensed and an output for providing a signal when the voltage at the sensor input falls within a predetermined range. The sensor employs a differential switch which has first and second inputs and an output which is coupled to the sensor output. A biasing arrangement is coupled with the first input and is adapted to provide a bias voltage which is substantially independent of the voltage at the sensor input. A circuit is coupled between the sensor input and the second input to the differential switch and is arranged to provide at the second input a voltage related to the sensor input voltage, which voltage effects switching of the differential switch to one state when the d.c. input voltage reaches a predetermined lower level and to the other state when the voltage reaches a level determined by the bias voltage.

9 Claims, 1 Drawing Figure

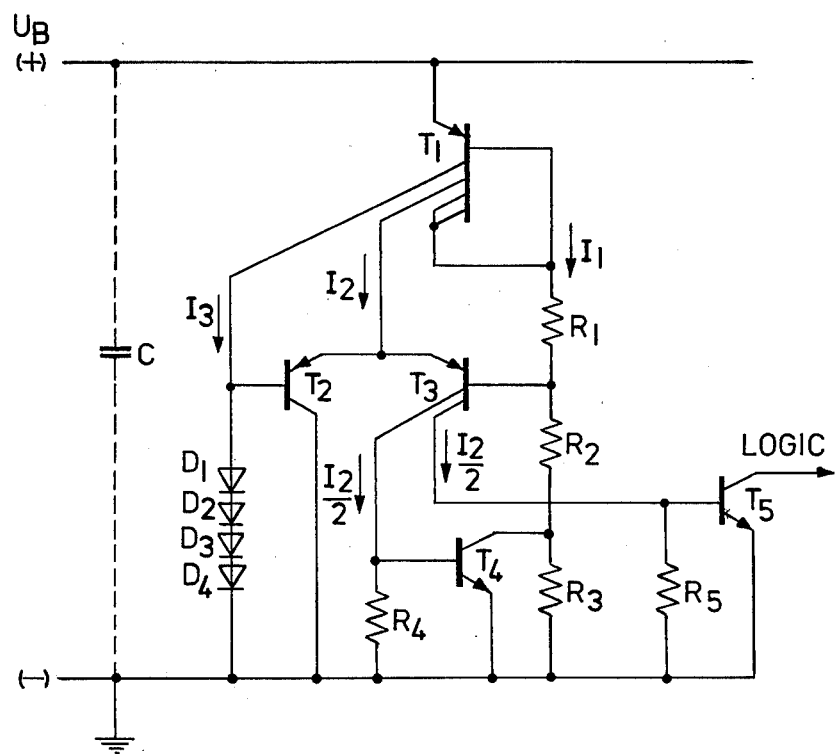

WINDOW DISCRIMINATOR OR VOLTAGE RANGE SENSOR

BACKGROUND OF THE INVENTION

The invention relates to a window discriminator circuit which with a changing direct voltage supply having a magnitude within a certain voltage range emits a defined output signal.

In many applications it is necessary to enforce a defined starting condition on certain logic or storage circuits when applying the operating voltage. A light dimmer is mentioned as an example of this which draws its supply voltage from the mains. When there is a failure in the mains it is necessary to ensure that the light dimmer remains disconnected when the mains voltage comes back. This means that while the mains voltage comes back operating instructions stored in a logic circuit for the light dimmer must be cancelled out.

SUMMARY OF THE INVENTION

The object underlying the invention is therefore to provide a window discriminator circuit which generates a defined output signal, within a certain voltage range, as the supply voltage is being restored. The output signal may be used, for example, to cancel information contained in a logic circuit or to re-establish a defined starting condition.

According to the invention from one aspect there is provided a d.c. voltage range sensor having an input for a d.c. voltage to be sensed and an output for providing a signal when a voltage at the sensor input falls within a predetermined range. The sensor comprises a differential switch having first and second inputs, and an output coupled to the sensor output; bias means coupled with the first input adapted to provide a bias voltage which is substantially independent of the voltage at the sensor input; and circuit means coupled between the sensor input and said second input to the differential switch adapted to provide at said second input a voltage related to the sensor input voltage which voltage effects switching of the differential switch to one state when the d.c. input voltage reaches a predetermined lower level and to the other state when the voltage reaches a level determined by said bias voltage.

According to another aspect of the invention, there is provided a window discriminator circuit which with a changing direct voltage supply within a certain voltage range emits a defined output signal, characterized in that a circuit is connected to the supply voltage source which produces a checking voltage depending on the supply voltage; that a Schmitt trigger is connected to this circuit, the Schmitt trigger being connected in defined manner when a certain lower checking voltage value is achieved; that a further circuit connected to the Schmitt trigger is provided at which a reference voltage substantially independent of the supply voltage is produced, its value determining the upper checking voltage value which when reached switched the Schmitt trigger.

In order that the invention and its various other preferred features may be understood more easily, an embodiment thereof will now be described, by way of example only, with reference to the drawing.

BRIEF DESCRIPTION OF THE DRAWING

The drawing is a circuit diagram of a discriminator circuit constructed in accordance with the invention.

DESCRIPTION OF THE PREFERRED EMBODIMENT

In a preferred embodiment of the window discriminator, a circuit is connected to a supply voltage source for producing a checking voltage dependent on the supply voltage. A Schmitt trigger is connected to this circuit, the trigger being connected in a defined manner when a certain lower checking voltage value is achieved. A further circuit is provided which is connected to the Schmitt trigger for producing a reference voltage which is substantially independent of the supply voltage, the value of the reference voltage determining the upper checking voltage value. The Schmitt trigger is switched when this checking voltage value is reached.

The supply voltage source may comprise a capacitor which is charged from the mains via a rectifier circuit.

A multi-collector transistor, which operates as a current image circuit and emits a supply current to the different circuit parts in accordance with the size ratios of the different collectors, is preferably provided for current supply of the voltage-producing circuits and of the Schmitt trigger. In an essentially conventional manner, a comparator may comprise two transistors connected together at the emitter electrodes whereby these emitter electrodes are connected to a collector of the multi-collector transistor. The changing checking voltage is supplied to the base electrode of one transistor, while the fixed reference voltage is present at the base electrode of the other transistor.

In the FIGURE a preferred circuit construction is shown which employs bipolar technology. This circuit is particularly suited for use in monolithically integrated circuits.

The entire circuit is connected between the two poles of a direct voltage supply and this means that a capacitor C supplying or smoothing the operating voltage is connected in parallel with the entire circuit. An operating voltage $U_B$ is impressed across the capacitor C and increases from a voltage O to an upper voltage value when the mains are connected, the upper voltage value being predetermined by a further circuit not shown in the FIGURE.

The emitter electrode of a multi-collector transistor $T_1$ is connected to one pole of the supply voltage and has three collectors in total in the embodiment shown. One collector electrode which is also connected to the base electrode of the multicollector transistor $T_1$ is twice as large as the two other collectors. This collector electrode is connected to a voltage divider which supplies a checking voltage that is dependent on the supply voltage. This voltage divider comprises series-connected resistors $R_1$, $R_2$ and $R_3$ in the embodiment shown. The resistor $R_3$ is connected to the other pole of the supply voltage.

A diode chain made up of diodes $D_1$ to $D_4$ connected in the flow direction is connected to one of the other two collectors of the multi-collector transistor $T_1$. A Schmitt trigger circuit comprising the transistors $T_2$, $T_3$ and $T_4$ is connected with the base electrode of transistor $T_2$ connected to the diode chain $D_1$–$D_4$ and the emitter electrodes of the two transistors $T_2$ and $T_3$ are connected together and to the remaining collector of the multi-collector transistor $T_1$. The diodes $D_1$ to $D_4$ are connected in series with each other and the diode chain is connected in parallel with the base collector path of the transistor $T_2$ so that the voltage drop across the diodes is the input voltage for the transistor $T_2$. The base electrode of the transistor $T_3$ is connected to the junction between resistors $R_1$ and $R_2$. This transistor $T_3$ has two collector electrodes preferably of the same size one of which is connected to the base electrode of a switching transistor $T_4$ and to a resistor $R_4$. The other collector electrode of transistor $T_3$ is connected to the base electrode of a switching transistor $T_5$ and to a resistor $R_5$. These resistors $R_4$ and $R_5$ bridge the base emitter paths of the related switching transistors $T_4 T_5$, respectively. The emitter collector path of the transistor $T_4$ bridges the resistor $R_3$ of the voltage divider so that this resistor is short-circuited when transistor $T_4$ is fully conductive. An output signal is derived at the collector electrode of the transistor $T_5$. The emitter electrodes of the transistors $T_4$ and $T_5$ as well as the collector electrode of the transistor $T_2$ are connected to one pole of the supply voltage source.

The transistors $T_4$ and $T_5$ are complementary to the transistors $T_2$ and $T_3$ of the Schmitt trigger and to the multi-collector transistor $T_1$. Thus the transistors $T_4$ and $T_5$ are npn-transistors having, for example, their emitter electrodes connected to the grounded negative pole. The remaining transistors $T_1$, $T_2$ and $T_3$ are pnp-transistors wherein the emitter electrode of the transistor $T_1$ is connected to the positive pole of the supply voltage source.

The circuit shown and described in detail functions as follows: when the mains voltage is first connected or restored the capacitor C slowly charges. With a very small voltage the operating condition of the circuit is not definable since the current flowing through the multi-collector transistor $T_1$ is not sufficient to drive the output transistor $T_5$ into its conducting state wherein current would flow between its collector and emitter electrodes. With a minimum value of $U_B$ i.e.:-

$$U_B = U_1 \tag{1}$$

the transistor $T_5$ becomes conductive. This minimum value is:

$$U_1 = I_1(R_1 + R_2 + R_3) + U_{BET1} \tag{2}$$

$R_3$ must be taken into consideration here since the transistor $T_4$ is blocked and thus the current $I_1$ also flows through the resistor $R_3$. The transistor $T_1$ operates as a current image circuit whereby the current through the voltage divider is twice as large as the current through the Schmitt trigger or through the diode chain because of the selected size ratios of the collectors. Thus:

$$I_1 = I_3 + I_2 \tag{3}$$

is true.

The current flowing through the Schmitt trigger is distributed evenly through the collectors of the transistor $T_3$ in one operating condition. This means that ($I_2/2$) flows through each collector of $T_3$. The minimum current at which the transistors $T_4$ and $T_5$ become conductive is:

$$I_{2min} = \frac{U_{BET4}}{R_4} + \frac{U_{BET5}}{R_5} \tag{4}$$

Since $I_3$ is just as large then, in accordance with formula 3:

$$I_1 = 2\left(\frac{U_{BET4}}{R_4} + \frac{U_{BET5}}{R_5}\right) \tag{5}$$

is true, if the resistors $R_4$ and $R_5$ are of the same size. Also, if it is stipulated that the base emitter voltages required to switch the transistors $T_4$ and $T_5$ on are of equal size then, for the current $I_1$, the value:

$$I_{1min} = \frac{4 U_{BET4}}{R_4} \tag{6}$$

is true.

If this value is introduced into Formula 2 then for the voltage $U_1$ at which the transistor $T_5$ becomes conductive, the following value is obtained:

$$U_1 = \frac{4 U_{BET4}}{R_4}(R_1 + R_2 + R_3) + U_{BET1} \tag{7}$$

If the voltage U reaches this value $U_1$ then a "0" signal is produced at the output of the transistor $T_5$ and a logic or storage circuit connected to transistor $T_5$ will respond in accordance with the "0" signal for example.

If the voltage across the capacitor C is greater than $U_1$, then the current flowing through the transistor $T_3$ is sufficient to drive the two transistors $T_4$ and $T_5$ into conduction. $R_3$ is short-circuited therefore by the collector-emitter path of transistor $T_4$ and this means that the current $I_1$, which is determined by the voltage divider, is increased since its magnitude is not effectively determined only by the resistors $R_1$ and $R_2$. This condition continues until the base potential at the transistor $T_3$ reaches the value of the base potential across the transistor $T_2$. This is the case at the voltage $$U_B = U_2 \tag{8}$$

Thus by neglecting the saturation voltage for the transistor $T_4$ the following is true:

$$U_2 = \frac{U_{F1} + U_{F2} + U_{F3} + U_{F4}}{R_2}(R_1 + R_2) + U_{BET1} \tag{9}$$

Where $U_{F1}$ to $U_{F4}$ means the forward voltage drops across diodes $D_1$ to $D_4$ of the diode chain respectively. If $U_B$ reaches the value $U_2$ the transistor $T_3$ is blocked and the transistor $T_2$ is conductive. If $T_3$ is blocked then transistors $T_4$ and $T_5$ are also blocked and the output signal of $T_5$ passed to the logic circuit becomes a "1" so that new instructions are again impressed by further signals supplied to the logic circuit from other circuit components. The base potential at the control electrode of $T_3$ is not determined by the resistors $R_1$, $R_2$ and $R_3$. Connection and disconnecton of the resistor $R_3$ causes hysteresis of the circuit shown since the transistor $T_5$ is only driven into conduction again with a voltage:

$$U_B = U_3 \tag{10}$$

which is smaller than the voltage $U_2$. This occurs if the voltage across the capacitor again decreases. Because of the effectiveness of all three resistors of the voltage divider the formula:

$$U_3 = \frac{4 U_F}{R_2 + R_3} (R_1 + R_2 + R_3) + U_{BET_1} \qquad (11)$$

is true for $U_3$.

In this case the forward voltage drops $U_F$ of the four diodes $D_1$ to $D_4$ are of equal size. The hysteresis of the circuit is determined by the voltage difference between the values $U_2$ and $U_3$.

The circuit in accordance with the invention may be used in a digital light dimmer for example in order to set a defined starting condition when there is a failure in the mains and when the voltage comes back. The capacitor C is charged to a maximum voltage of 8 V for example. With a voltage $U_1$ of approximately 2 V the transistor $T_5$ is driven into conduction. With a voltage of approximately 5 V the transistor $T_5$ is blocked again. A preferred position is enforced on a logic circuit connected to the output of transistor $T_5$ by the starting command which is provided in the voltage range between 2 and 5 V by the transistor $T_5$. Alternatively, the storage content of a command circuit can be cancelled, for example. Only when a voltage of approximately 8 V is reached is a pulse supplied to the logic circuit by a further circuit not described here, and the light dimmer circuit can then be shifted into any desired operating condition again according to this pulse by means of external commands.

It will be appreciated that instead of the Schmitt trigger other types of differential switch may be employed.

It will be understood that the above description of the present invention is susceptible to various modification changes and adaptations.

We claim:

1. A window discriminator circuit for switching the output voltage thereof from a first state to a second state when the voltage of a supply voltage source connected thereto is increased to a first predetermined value, and from said second state back to said first state when said voltage is further increased to a second predetermined value, comprising:
    a current source connected to a first terminal of said voltage supply source;
    a voltage divider including at least first, secnd and third resistors connected between said current source and a second terminal of said supply voltage source;
    a reference voltage source connected between said current source and said second terminal of said supply voltage source;
    first and second transistors each having base, emitter and collector electrodes, the emitter electrodes of said first and second transistor being coupled to said current source, the base electrode of said first transistor to said reference voltage source, the base electrode of said second transistor between the first and second resistors of said voltage divider, and the collector electrode of said first transistor to said second terminal of said supply voltage source and;
    a third transistor having a base electrode connected to a collector electrode of said second transistor, and emitter and collector electrodes connected across the third resistor of said voltage divider, said second transistor being switched on when the voltage of said supply voltage source reaches said first predetermined value and off when said voltage reaches said second predetermined value, said first transistor being switched on when said voltage reaches said second predetermined value.

2. A window discriminator circuit according to claim 1 wherein said supply voltage source comprises a capacitor changed by an external voltage source.

3. A window discriminator circuit according to claim 1 wherein said current source is a multi-collector transistor; and wherein said voltage divider, reference voltage source and first and second transistors are supplied with current from respective collectors of said multicollector transistor.

4. A window discriminator circuit according to claim 3 wherein the surface area of the collector of said multicollector transistor which is connected to said voltage divider is twice as large as the surface area of the collectors connected to said reference voltage source and to said first and second transistors.

5. A window discriminator circuit according to claims 1 or 3 wherein said second transistor has two collector electrodes; and which further comprises a fourth transistor having a base electrode coupled to one of the collectors of said second transistor, a fourth resistor coupling the base of said third transistor and the other collector of said second transistor to the second terminal of said supply voltage source, and a fifth resistor coupled between the base and emitter of said fourth transistor, the junction of said fifth resistor and emitter of said fourth transistor being connected to said second terminal of said supply voltage source, said output voltage appearing at the collector electrode of said fourth transistor.

6. A window discriminator circuit according to claim 5 wherein both collector electrodes of said second transistor have the same surface area.

7. A window discriminator circuit according to claim 5 wherein said first and second transistors are of a type complementary to that of said third and fourth transistors.

8. A window discriminator circuit according to claim 1 wherein said reference voltage source comprises at least one diode connected between the base and collector electrodes of said first transistor.

9. A window discriminator circuit according to claim 1 wherein said reference voltage source comprises a plurality of series-connected diodes connected between the base and collector electrodes of said first transistor.

* * * * *